United States Patent
Taniguchi et al.

(10) Patent No.: US 6,410,615 B1
(45) Date of Patent: Jun. 25, 2002

(54) SEMICONDUCTOR SEALING EPOXY RESIN COMPOSITION AND SEMICONDUCTOR DEVICE USING THE SAME

(75) Inventors: Takashi Taniguchi; Minoru Yamane; Tsutomu Nishioka; Tadaaki Harada; Toshitsugu Hosokawa; Kazuhiro Ikemura; Sadahito Misumi; Shinichi Ohizumi, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/485,389

(22) PCT Filed: Jun. 3, 1999

(86) PCT No.: PCT/JP99/02978

§ 371 (c)(1),
(2), (4) Date: Feb. 9, 2000

(87) PCT Pub. No.: WO99/64513

PCT Pub. Date: Dec. 16, 1999

(30) Foreign Application Priority Data

Jun. 9, 1998 (JP) ............................................. 10-161107

(51) Int. Cl.⁷ .......................... C08L 63/00; C08K 3/36; C08K 9/10; C08G 59/62; H01L 23/29
(52) U.S. Cl. ....................... 523/211; 257/793; 523/466; 524/904; 525/524; 525/934
(58) Field of Search ................................ 523/211, 466; 525/524, 934; 524/904; 257/793

(56) References Cited

U.S. PATENT DOCUMENTS

| | | | | |
|---|---|---|---|---|
| 4,237,252 A | * | 12/1980 | Newell et al. | ........... 523/466 X |
| 4,271,061 A | * | 6/1981 | Suzuki et al. | ........... 523/466 X |
| 4,681,904 A | * | 7/1987 | Yasuda et al. | ........... 525/524 X |
| 4,734,468 A | * | 3/1988 | Marx | .......................... 525/524 |
| 5,049,596 A | * | 9/1991 | Fujimoto et al. | ........ 525/934 X |
| 5,149,730 A | * | 9/1992 | Murata et al. | ............... 523/466 |
| 5,264,503 A | * | 11/1993 | Marx | ...................... 525/524 X |
| 5,565,709 A | | 10/1996 | Fukushima et al. | ......... 257/787 |
| 6,248,454 B1 | * | 6/2001 | Ikemura | ................ 523/211 X |

FOREIGN PATENT DOCUMENTS

| | | | |
|---|---|---|---|
| EP | 0 829 455 A2 | 3/1998 | |
| JP | 61-115342 | * 6/1986 | .................. 523/466 |
| JP | 62-074924 | * 4/1987 | .................. 523/211 |
| JP | 8-301978 | 11/1996 | ........... C08G/59/18 |
| JP | 8-337633 | 12/1996 | ........... C08G/59/18 |
| JP | 9-3164 | 1/1997 | ........... C08G/59/40 |
| JP | 9-77959 | 3/1997 | ........... C08L/63/00 |
| JP | 9-199523 | 7/1997 | ........... H01L/21/56 |
| JP | 10-120878 | 5/1998 | ........... C08L/63/02 |
| WO | WO 94/02528 | 2/1994 | |

OTHER PUBLICATIONS

Foreign Language International Search Report Aug. 1999.
European Search Report dated Jan. 28, 2002.

* cited by examiner

Primary Examiner—Richard D. Lovering
(74) Attorney, Agent, or Firm—Sughrue Mion, PLLC

(57) ABSTRACT

An epoxy resin composition for semiconductor encapsulation comprising an epoxy resin, a phenolic resin, a hardening accelerator and an inorganic filler. The epoxy resin composition having the following properties (X) to (Z) does not cause the chip tilting attributable to resin flow during resin encapsulation, such as semiconductor element shifting or gold wire deformation, and can obtain highly reliable semiconductor devices:

(X) the viscosity thereof as measured with a flow tester at 175° C. is from 50 to 500 P;

(Y) the minimum melt viscosity thereof as determined from the temperature dependence of viscosity thereof as measured with a dynamic viscoelastic meter at a shear rate of 5 (1/s) is $1 \times 10^5$ poise or lower; and (Z) the ratio of the viscosity thereof as measured at 90° C. (Z1) to that as measured at 110° C. (Z2) both with a dynamic viscoelastic meter at a shear rate of 5 (1/s), (Z1/Z2), is 2.0 or higher.

5 Claims, 2 Drawing Sheets

SEMICONDUCTOR SEALING EPOXY RESIN COMPOSITION AND SEMICONDUCTOR DEVICE USING THE SAME

This application is a 371 of PCT/JP99/02978 filed Jun. 3, 1999.

TECHNICAL FIELD

The present invention relates to an epoxy resin composition for semiconductor encapsulation which is effective in mitigating molding failures (chip tilting) occurring during resin encapsulation by transfer molding, etc., and is capable of imparting high reliability, and to a semiconductor device obtained with the composition.

BACKGROUND ART

Semiconductor elements such as transistors, ICs and LSIs have conventionally been encapsulated in plastic packages represented by, for example, dual inline packages (DIPs) to produce semiconductor devices from the standpoints of protection from the surrounding atmosphere and facilitating the handling of semiconductor elements.

As the prior art encapsulation materials used for such plastic packages, epoxy resin compositions are used.

However, the semiconductor devices obtained by encapsulating semiconductor elements with conventional encapsulation materials by transfer molding or another molding technique have a drawback of poor reliability. This is because there are cases where the resin flow during molding may slightly shift the semiconductor element placed within the mold in its original right position or may deform the gold wires disposed by wire bonding.

The present invention has been made in view of such circumstances, and objects of the present invention are to provide an epoxy resin composition for semiconductor encapsulation which does not cause the chip tilting attributable to resin flow during resin encapsulation, such as semiconductor element shifting and gold wire deformation, and is capable of yielding highly reliable semiconductor devices, and a semiconductor device obtained with the epoxy resin composition.

DISCLOSURE OF THE INVENTION

For accomplishing the above objects, the first aspect of the present invention resides in an epoxy resin composition for semiconductor encapsulation which comprises an epoxy resin, a phenolic resin, a hardening accelerator and an inorganic filler, said epoxy resin composition having the following properties (X) to (Z):

(X) the viscosity thereof as measured with a flow tester at 175° C. is from 50 to 500 poise;

(Y) the minimum melt viscosity thereof as determined from the temperature dependence of viscosity thereof as measured with a dynamic viscoelastic meter at a shear rate of 5 (1/s) is $1 \times 10^5$ poise or lower; and (Z) the ratio of the viscosity thereof as measured at 90° C. (Z1) to that as measured at 110° C. (Z2) both with a dynamic viscoelastic meter at a shear rate of 5 (1/s), (Z1/Z2), is 2.0 or higher.

The second aspect of the present invention resides in a semiconductor device produced by encapsulating a semiconductor element with the above epoxy resin composition for semiconductor encapsulation.

The present inventors made intensive investigations on epoxy resin compositions as encapsulation materials mainly with respect to the viscosity characteristics thereof in order to prevent the chip tilting occurring upon resin encapsulation by transfer molding, etc., such as semiconductor element shifting or gold wire deformation, to thereby obtain highly reliable semiconductor devices. As a result, the present inventors have found that when an epoxy resin composition is regulated so that the viscosity thereof as measured with a flow tester at 175° C. [property (X)], the minimum melt viscosity thereof as measured with a dynamic viscoelastic meter [property (Y)], and the ratio of the viscosity thereof at 90° C. (Z1) to that at 110° C. (Z2) [(Z1/Z2); property (Z)] are within respective specific ranges, then the encapsulation problems are prevented from occurring and semiconductor devices having high reliability can be obtained, and have reached the present invention.

By regulating the content of the inorganic filler as a component of the epoxy resin composition for semiconductor encapsulation to a value within a specific range, the packages formed from the composition can decrease water absorption. As a result, the semiconductor devices produced with the composition can retain high reliability after mounting.

Furthermore, when the hardening accelerator as a component of the epoxy resin composition for semiconductor encapsulation is microcapsules containing a hardening accelerator which have a core/shell structure composed of a core comprising the hardening accelerator and a shell comprising a synthetic resin with which the core is covered, the components of the epoxy resin composition can be melt-kneaded for a longer period than conventional ones and at a higher temperature. As a result, it is easy to obtain an epoxy resin composition having the viscosity properties (X) to (Z) described above.

BEST MODE FOR PRACTICING THE INVENTION

Figure 1:
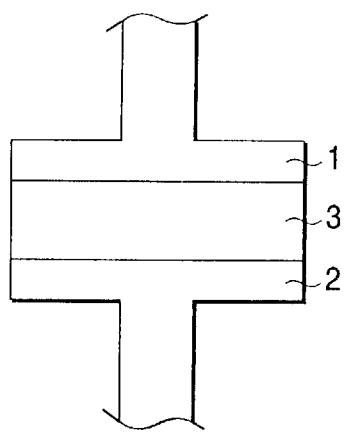
FIG. 1 is a diagrammatic view illustrating a method for determining properties (Y) and (Z) according to the present invention.

The epoxy resin composition for semiconductor encapsulation of the present invention can be obtained from an epoxy resin (ingredient A), a phenolic resin (ingredient B), a hardening accelerator (ingredient C) and an inorganic filler (ingredient D). The resin composition is generally in the form of a powder or of tablets obtained therefrom through pelletizing.

The epoxy resin (ingredient A) is not particularly limited and various conventionally known epoxy resins are usable. Examples thereof include o-cresol-novolak type epoxy resins, phenol-novolak type epoxy resins, biphenyl type epoxy resins, bisphenol A type epoxy resins, and naphthalene type epoxy resins. These epoxy resins may be used alone or in combination of two or more thereof. Preferred of these are biphenyl type epoxy resins represented by the following general formula (1). Especially preferred is the biphenyl type epoxy resin represented by the formula wherein $R_1$ to $R_4$ are all methyl.

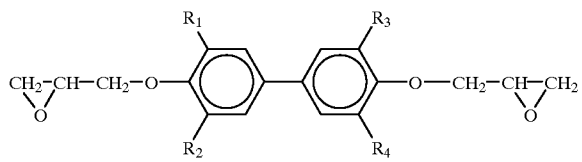

(1)

(In formula (1), $R_1$ to $R_4$ may be the same or different and each represents H or an alkyl group having 1 to 5 carbon atoms.)

The phenolic resin (ingredient B) used in combination with the epoxy resin (ingredient A) functions as a hardener for the epoxy resin. This phenolic resin, which means a resin having phenolic hydroxyl groups, is not particularly limited and various conventionally known phenolic resins are usable. Examples thereof include novolak resins such as cresol-novolak resins, xylylene-modified phenolic resins such as phenol-aralkyl resins, terpene-modified phenolic resins, and dicyclopentadiene-modified phenolic resins. These phenolic resins may be used alone or in combination of two or more thereof. Where the epoxy resin used is a biphenyl type epoxy resin represented by general formula (1), it is preferred to use as the phenolic resin a phenol-aralkyl resin represented by the following general formula (2).

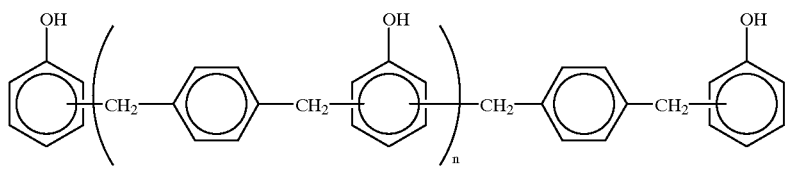

(2)

(In formula (2), n is a positive integer.)

The epoxy resin (ingredient A) and the phenolic resin (ingredient B) are incorporated preferably in a proportion such that the amount of the hydroxyl groups of the phenolic resin is from 0.8 to 1.2 equivalents to the epoxy groups of the epoxy resin. The more preferred range thereof is from 0.9 to 1.1 equivalents. The total amount of ingredient A and ingredient B incorporated is preferably 8 to 20% by weight, more preferably 8 to 13% by weight, based on the entire epoxy resin composition.

Examples of the hardening accelerator (ingredient C) used in combination with ingredients A and B described above include amines, imidazoles and organophosphorus compounds such as phosphine compounds or quaternary phosphonium compounds.

Also usable as the hardening accelerator is a microcapsule type hardening accelerator which has a core/shell structure composed of a core comprising a hardening accelerator and a shell comprising a synthetic resin with which the core is covered. Use of this microcapsule type hardening accelerator is advantageous in that an epoxy resin composition for semiconductor encapsulation having properties (X) to (Z), which are characteristic of the present invention, can easily be obtained.

The hardening accelerator to be microencapsulated as the core is not particularly limited, and conventional ones are usable. However, in this case, the hardening accelerator is preferably one which is in a liquid state at room temperature, from the standpoints of workability in microcapsule preparation and properties of the microcapsules to be obtained. The term "liquid state at room temperature (e.g., about 15–40° C.; hereinafter the same)" is used to mean not only a hardening accelerator which itself is liquid at room temperature but a hardening accelerator which itself is solid at room temperature but is in the form of a liquid prepared by being dissolved or dispersed in any desired organic solvent or the like.

Examples of the above hardening accelerator include amines, imidazoles, and phosphorus type, boron type and phosphorus-boron type hardening accelerator. Specific examples thereof include alkyl-substituted guanidines such as ethylguanidine, trimethylguanidine, phenylguanidine or diphenylguanidine; 3-(substituted phenyl)-1,1-dimethylureas such as 3-(3,4-dichlorophenyl)-1,1-dimethylurea, 3-phenyl-1,1-dimethylurea or 3-(4-chlorophenyl)-1,1-dimethylurea; imidazolines such as 2-methylimidazoline, 2-phenylimidazoline, 2-undecylimidazoline or 2-heptadecylimidazoline; monoaminopyridines such as 2-aminopyridine; amine-imides such as N,N-dimethyl-N-(2-hydroxy-3-allyloxypropyl)amine-N'-lactimide; organophosphorus compounds such as ethylphosphine, propylphosphine, butylphosphine, phenylphosphine, trimethylphosphine, triethylphosphine, tributylphosphine, trioctylphosphine, triphenylphosphine, tricyclohexylphosphine, triphenylphosphine/triphenylborane complex or tetraphenylphosphonium tetraphenylborate; and diazabicycloundecene compounds such as 1,8-diazabicyclo[5.4.0] undecene-7 or 1,4-diazabicyclo[2.2.2]octane. Preferred of these from the standpoints of ease of the microencapsulation thereof and ease of handling are the organophosphorus compounds including triphenylphosphine and the imidazole compounds. Those hardening accelerators may be used alone or in combination of two or more thereof.

The organic solvent which can be encapsulated in the shells (wall films) of the microcapsules is not particularly limited so long as it is liquid at room temperature. It is, however, necessary to select a solvent in which the shells (wall films) do not dissolve. Examples thereof include organic solvents such as ethyl acetate, methyl ethyl ketone, acetone, methylene chloride, xylene, toluene or tetrahydrofuran, and oils such as phenylxylylethane or dialkylnaphthalenes.

Examples of the thermoplastic resin constituting the shells (wall films) include polyureas, polyurethanes, amino resins and acrylic resins. Of these, polyureas are preferred from the standpoints of storage stability and ease of shell breakage in molding for forming a cured resin.

Especially preferred polyureas are polymers comprising repeating units repeated by the following general formula (3) as a major constituent component.

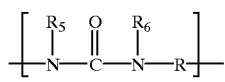

(In general formula (3), R represents a bivalent organic group, and $R_5$ and $R_6$ are the same or different and each represents a hydrogen atom or a monovalent organic group.)

The polymers comprising repeating units represented by general formula (3) as a major constituent component are obtained by, for example, the polyaddition reaction of a polyisocyanate with a polyamine. Alternatively, these polymers are obtained by reacting a polyisocyanate with water.

The above polyisocyanate is not particularly limited so long as it is a compound having two or more isocyanate groups in the molecule. Examples thereof include diisocyanates such as m-phenylene diisocyanate, p-phenylene diisocyanate, 2,4-tolylene diisocyanate, 2,6-tolylene diisocyanate, naphthalene 1,4-diisocyanate, diphenylmethane 4,4'-diisocyanate, 3,3'-dimethoxy-4,4'-biphenyl diisocyanate, 3,3'-dimethyldiphenylmethane 4,4'-diisocyanate, xylylene 1,4-diisocyanate, 4,4'-diphenylpropane diisocyanate, trimethylene diisocyanate, hexamethylene diisocyanate, propylene 1,2-diisocyanate, butylene 1,2-diisocyanate, cyclohexylene 1,2-diisocyanate or cyclohexylene 1,4-diisocyanate; triisocyanates such as p-phenylene diisothiocyanate, xylylene 1,4-diisothiocyanate or ethylidyne diisothiocyanate; tetraisocyanates such as 4,4'-dimethyldiphenylmethane 2,2',5,5'-tetraisocyanate; and isocyanate prepolymers such as hexamethylene diisocyanate/hexanetriol adducts, 2,4-tolylene diisocyanate/catechol adducts, tolylene diisocyanate/hexanetriol adducts, tolylene diisocyanate/trimethylolpropane adducts, xylylene diisocyanate/trimethylolpropane adducts, hexamethylene diisocyanate/trimethylolpropane adducts or trimers of aliphatic polyisocyanates such as triphenyldimethylene triisocyanate, tetraphenyltrimethylene tetraisocyanate, pentaphenyltetramethylene pentaisocyanate, lysine isocyanate or hexamethylene diisocyanate. These polyisocyanates may be used alone or in combination of two or more thereof.

Preferred of these polyisocyanates from the standpoints of film-forming properties in microcapsule preparation and mechanical strength are tolylene diisocyanate/trimethylolpropane adducts, xylylene diisocyanate/trimethylolpropane adducts and isocyanate prepolymers represented by polymethylenepolyphenyl isocyanates such as triphenyldimethylene triisocyanate.

On the other hand, the polyamines to be reacted with the polyisocyanates are not particularly limited so long as it is a compound having two or more amino groups in the molecule. Examples thereof include diethylenetriamine, triethylenetetramine, tetraethylenepentamine, 1,6-hexamethylenediamine, 1,8-octamethylenediamine, 1,12-dodecamethylenediamine, o-phenylenediamine, m-phenylenediamine, p-phenylenediamine, o-xylylenediamine, m-xylylenediamine, p-xylylenediamine, methanediamine, bis(4-amino-3-methylcyclohexyl) methane, isophoronediamine, 1,3-diaminocyclohexane and spiroacetal type diamines. These polyamines may be used alone or in combination of two or more thereof.

In the reaction of any of the above polyisocyanates with water, part of thepolyisocyanate first hydrolyzes to form an amine, which reacts with unreacted isocyanate groups (undergoes a self-polyaddition reaction) to thereby form a polymer comprising repeating units represented by general formula (3) as a major component.

The microcapsules containing a hardening accelerator are not particularly limited so long as the hardening accelerator has been microencapsulated. They can be prepared by various conventional techniques. An especially preferred microencapsulation technique is to use interfacial polymerization to form shells (wall films), because this technique is advantageous in forming homogeneous shells (wall films) and controlling the wall thickness.

The microcapsules containing a hardening accelerator produced through interfacial polymerization are obtained, for example, in the following manner. A polyisocyanate is dissolved in a liquid hardening accelerator serving as a core ingredient. The resulting solution, which is oily, is dispersed as oil droplets in a water phase to prepare an O/W (oil phase/water phase) emulsion. From the standpoint of emulsion stability during polymerization, this emulsification is preferably conducted so that the dispersed oil droplets have an average particle diameter of about from 0.05 to 50 $\mu$m, preferably about from 0.05 to 10 $\mu$m.

On the other hand, where a solid hardening accelerator which has been dissolved in an organic solvent is used as a core ingredient, an S/O/W (solid phase/oil phase/water phase) emulsion is obtained when the hardening accelerator is oleophilic. When the hardening accelerator is hydrophilic, an emulsion of the above type is difficult to prepare. In this case, however, an O/O (oil phase/oil phase) emulsion or an S/O/O (solid phase/oil phase/oil phase) emulsion can be prepared by suitably selecting solvents based on solubility, and this emulsion may be subjected to interfacial polymerization.

Subsequently, a polyamine or a polyhydric alcohol is added to the water phase of the emulsion to cause interfacial polymerization with the polyisocyanate contained in the oil phase. Thus, a polyaddition reaction is conducted. As a result, microcapsules containing the hardening accelerator are obtained in which the shells (wall films) are preferably made of a polyurea type polymer.

The thus-obtained microcapsules containing a hardening accelerator have a core/shell structure, in which the hardening accelerator as a core ingredient is encapsulated in the shell. These microcapsules containing a hardening accelerator can be isolated by a conventionally known means, for example, by centrifuging and subsequent drying or by spray drying. It is also possible to dissolve or mix the microcapsules in or with the epoxy resin or hardener. In this case, the organic solvent contained in the microcapsules can be removed, if desired and necessary, by additionally conducting vacuum drying or the like.

The average particle diameter of these microcapsules containing a hardening accelerator is regulated to a value in the range of preferably from 0.05 to 10 $\mu$m, more preferably from 0.1 to 4 $\mu$m, from the standpoints of the stability of the microcapsules themselves, shear force applied thereto in producing an epoxy resin composition, even dispersibility, etc., as will be described later. It is also preferred to regulate the microcapsule size so that the maximum particle diameter of the microcapsules containing a hardening accelerator is not larger than 20 $\mu$m. By regulating the microcapsules containing a hardening accelerator so as to have an average particle diameter within the above range, the microcapsules can be inhibited from being broken by the shear force applied thereto in producing an epoxy resin composition. By regulating the microcapsules so as to have a maximum particle diameter not larger than 20 $\mu$m besides the average particle diameter, the microcapsules can be evenly dispersed into an epoxy resin. Although the shape of the microcapsules containing a hardening accelerator in the present invention is preferably spherical, it may be ellipsoidal. When the microcapsules each does not have an unconditionally determined particle diameter as in the case where the microcapsules are not truly spherical but ellipsoidal, flat, or the like, then the simple average of the longest major diameter and the shortest minor diameter is taken as the average particle diameter thereof.

In the microcapsules containing a hardening accelerator, the amount of the encapsulated hardening accelerator is preferably from 5 to 70% by weight, more preferably from 10 to 50% by weight, based on the whole microcapsules. That is, if the amount of the encapsulated hardening accelerator is smaller than 5% by weight, the resins show poor reactivity and require too long a time period for curing reaction. On the other hand, if the amount of the encapsulated hardening accelerator exceeds 70% by weight, the shells (wall films) have too small a thickness and there is hence a fear that the encapsulated hardening accelerator (core ingredient) may be poorly isolated or the shells may have poor mechanical strength.

The proportion of the thickness of the shells (wall films) to the particle diameter of the microcapsules containing a hardening accelerator is regulated preferably to 3 to 25%, more preferably to 5 to 25%. That is, if the proportion thereof is below 3%, the shells do not have mechanical strength sufficient to withstand the shear to be imposed thereon in a kneading step in producing an epoxy resin composition. If the proportion thereof exceeds 25%, the release of the encapsulated hardening accelerator tends to be insufficient.

The inorganic filler (ingredient D) used in combination with ingredients A to C described above is not particularly limited, and conventional ones are usable. Examples thereof include silica powders, such as a powder of fused silica and a powder of crystalline silica, and alumina powders. The inorganic fillers may have any of various particle shapes such as irregular shapes formed by crushing, a spherical shape, and ground shapes. These inorganic fillers may be used alone or as a mixture of two or more thereof. From the standpoint of obtaining satisfactory flowability, it is preferred to use one or more inorganic fillers which as a whole have an average particle diameter of from 6 to 40 μm. Especially preferred among the aforementioned inorganic fillers from the standpoint of satisfactory flowability are ground particles of crystalline silica and spherical particles of fused silica.

The incorporation amount of the inorganic filler (ingredient D) is regulated to preferably from 80 to 92% by weight, more preferably from 87 to 92% by weight, based on the epoxy resin composition. That is, if the incorporation amount of the inorganic filler (ingredient D) is smaller than 80% by weight, packages obtained from the composition through molding tend to have enhanced water absorption to cause the semiconductor devices to have reduced reliability after mounting. If the incorporation amount thereof exceeds 92% by weight, the composition tends to have impaired flowability.

If desired and necessary, other additives may be suitably added to the epoxy resin composition for semiconductor encapsulation of the present invention besides ingredients A to D described above. The amount of each of the other additives included is generally 0.01 to 2% by weight based on the weight of the entire composition.

Examples of the other additives include release agents, flame retardants, colorants, silane coupling agents, and stress relieving agents.

Examples of the release agents include conventionally known release agents such as long-chain carboxylic acids, e.g., stearic acid and palmitic acid, metal salts of long-chain carboxylic acids, e.g., zinc stearate and calcium stearate, and waxes, e.g., polyethylene wax, carnauba wax, and montan wax.

Examples of the flame retardants include brominated epoxy resins. Flame retardant aids such as, e.g., antimony trioxide and antimony pentoxide are also usable.

Examples of the colorants include carbon black.

Examples of the stress relieving agents include butadiene rubbers such as methyl acrylate/butadiene/styrene copolymers and methyl methacrylate/butadiene/styrene copolymers and silicone compounds. Furthermore, an ion trapping agent such as a hydrotalcite, bismuth hydroxide, or the like may be incorporated for the purpose of obtaining improved reliability in a moisture resistance test.

The epoxy resin composition for semiconductor encapsulation of the present invention can be produced, for example, in the following manner. First, ingredients A to D described above and other additives described above are suitably mixed together, and this mixture is treated with a kneader, e.g., mixing rolls, to melt-mix the ingredients with heating. This melt is cooled to room temperature, subsequently pulverized by a known means, and then pelletized if desired. Through a series of these steps, the epoxy resin composition can be produced.

Where the hardening accelerator to be used is the above-described microcapsules containing a hardening accelerator, the first step is to produce the microcapsules by the method described hereinabove. Subsequently, the remaining ingredients are added thereto and this mixture is treated with a kneader, e.g., mixing rolls, to melt-mix the ingredients with heating. This melt is cooled to room temperature, subsequently pulverized by a known means, and then pelletized if desired. Through a series of those steps, the epoxy resin composition can be produced. A combination of two or more silica powders differing in average particle diameter is preferably used as an inorganic filler together with the microcapsules containing a hardening accelerator. For example, use of a silica powder composed of spherical particles of fused silica having a large average particle diameter in combination with a silica powder composed of crushed particles of fused silica having a smaller average particle diameter than the above one is preferred from the standpoint of flowability.

In producing the epoxy resin composition for semiconductor encapsulation of the present invention which contains the microcapsules containing a hardening accelerator, the melt mixing with a kneader or the like is generally conducted at a higher temperature for a longer period than in the production of ordinary encapsulation materials, as long as the microcapsules do not break. Namely, due to the use of the microcapsules containing a hardening accelerator, a higher kneading temperature and a longer kneading period can be used as compared with the case where an ordinary curing accelerator is used. As a result, the inorganic ingredient can be satisfactorily wetted by organic ingredients during kneading. As the surface of the inorganic ingredient is wetted in a higher degree, the viscosity ratio (Z1/Z2), i.e., the ratio of the viscosity of the composition as measured at 90° C. (Z1) to that as measurement at 110° C. (Z2) both with a dynamic viscoelastic meter at a shear rate of 5 (1/s), becomes larger. Consequently, a material having excellent moldability can be obtained. This effect is demonstrated in Examples which will be given later.

The epoxy resin composition for semiconductor encapsulation of the present invention should have the following properties (X) to (Z).

(X) The viscosity thereof as measured with a flow tester at 175° C. is from 50 to 500 poise.

(Y) The minimum melt viscosity thereof as determined from the temperature dependence of viscosity thereof as measured with a dynamic viscoelastic meter at a shear rate of 5 (1/s) is $1 \times 10^5$ poise or lower.

(Z) The ratio of the viscosity thereof as measured at 90° C. (Z1) to that as measured at 110° C. (Z2) both with a dynamic viscoelastic meter at a shear rate of 5 (1/s), (Z1/Z2), is 2.0 or higher.

In property (X) above, the viscosity of the epoxy resin composition as measured at a temperature of 175° C. with a flow tester viscometer (e.g., a Koka flow tester manufactured by Shimadzu Corp.) should be from 50 to 500 poise. The viscosity thereof at 175° C. is especially preferably from 50 to 300 poise. That is, if the viscosity thereof is lower than 50 poise, air inclusion occurs during molding due to the too low viscosity of the composition to pose a problem of voids. If the viscosity thereof exceeds 500 poise, the gold wire deformation described above and filling failures occur due to the too high viscosity of the composition.

Property (X) can be determined in the following manner.

Two grams of a powder of the epoxy resin composition (6 mesh-pass powder) is compacted at 20° C. and a pressure of 100 kgf/cm² to obtain a cylindrical sample having a diameter of 9.8 mm. This sample is examined with a flow tester viscometer (e.g., Koka flow tester Type CFT-100, manufactured by Shimadzu Corp.) to measure the viscosity thereof at 175° C. Other conditions for the measurement are as follows. The die nozzle used has a diameter of 1.0 mm and a length of 10.0 mm, and the load imposed on the sample is 10 kg.

In property (Y) above, the minimum melt viscosity of the epoxy resin composition as determined from the temperature dependence of viscosity thereof as measured with a dynamic viscoelastic meter at a shear rate of 5 (1/s) should be $1 \times 10^5$ poise or lower. The minimum melt viscosity thereof is especially preferably $5 \times 10^4$ poise or lower. This is because if the minimum melt viscosity thereof exceeds $1 \times 10^5$ poise, the composition has too high a viscosity when it flows in the mold cavity during molding. This means that higher minimum melt viscosities result in an enhanced tendency to arouse molding troubles such as gold wire deformation and chip tilting.

In property (Z) above, the ratio of the viscosity of the epoxy resin composition as measured at 90° C. (Z1) to that as measured at 110° C. (Z2) both with a dynamic viscoelastic meter at a shear rate of 5 (1/s), (Z1/Z2), should be 2.0 or higher. The Z1/Z2 thereof is especially preferably 2.5 or higher. This is because if the Z1/Z2 thereof is below 2.0, the viscosity decrease of the composition with increasing temperature is small and the composition hence has too high a minimum melt viscosity. This means that too small values of Z1/Z2 result in an enhanced tendency to arouse molding troubles such as gold wire deformation and chip tilting.

Properties (Y) and (Z) are determined in the following manner. A pellet (diameter, 25 mm; weight, 2 g) as an encapsulation material is first prepared. by compacting 2 g of a powder of the epoxy resin composition (6 mesh-pass powder) at 20° C. and a pressure of 100 kgf/cm² to obtain a sample in the form of a disk having a diameter of 25 mm. Subsequently, the pellet 3 is set on a dynamic viscoelastic meter (manufactured by Rheometrics Inc.) by sandwiching the pellet 3 between the upper plate 1 and the lower plate 2 as shown in FIG. 1. A strain of 2% is imposed on the sample, and the torque is measured under the conditions of a shear rate of 5 (1/s) and a heating rate of 16° C./min. The viscosity of the sample is determined from the torque.

Methods for encapsulating a semiconductor element with the epoxy resin composition for semiconductor encapsulation described above are not particularly limited. The encapsulation can be conducted by a known molding technique, e.g., ordinary transfer molding.

The present invention will be explained below in more detail by reference to Examples and Comparative Examples.

Prior to the Examples, the following compounds were prepared.

[Epoxy Resin]

Biphenyl type epoxy resin represented by the following formula (4) (epoxy equivalent, 200).

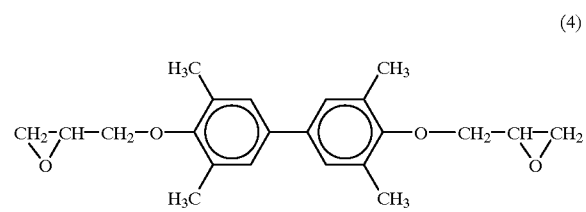

(4)

[Phenolic Resin]

Phenol-aralkyl resin represented by general formula (2) given above (wherein n is 0 to 21; hydroxyl equivalent, 175).

[Inorganic Filler D1]

Spherical powder of fused silica (average particle diameter, 30 µm).

[Inorganic Filler D2]

Spherical powder of fused silica (average particle diameter, 15 µm).

[Inorganic Filler D3]

Crushed powder of fused silica (average particle diameter, 15 µm).

[Inorganic Filler D4]

Crushed powder of fused silica (average particle diameter, 6 µm)

[Release Agent]

Polyethylene wax.

[Microcapsules Containing Hardening Accelerator]

Eleven parts by weight of a xylylene diisocyanate/trimethylolpropane adduct in a 3/1 molar ratio and 4.6 parts by weight of a tolylene diisocyanate/trimethylolpropane adduct in a 3/1 molar ratio were uniformly dissolved in a mixture of 7 parts by weight of triphenylphosphine as a hardening accelerator and 3.9 parts by weight of ethyl acetate to prepare an oil phase.

An aqueous phase composed of 100 parts by weight of distilled water and 5 parts by weight of poly(vinyl alcohol) was separately prepared. Thereto was added the oil phase. This mixture was treated with a homomixer to obtain an emulsion, which was introduced into a polymerizer equipped with a reflux condenser, stirrer, and dropping funnel.

On the other hand, 10 parts by weight of an aqueous solution containing 3 parts by weight of triethylenetetramine was prepared. This solution was placed in the dropping funnel attached to the polymerizer. The aqueous solution was added dropwise to the emulsion in the polymerizer to conduct interfacial polymerization at 70° C. for 3 hours. Thus, an aqueous suspension of a microcapsule type hardening accelerator was obtained. This suspension was centrifuged to remove the poly(vinyl alcohol) and other ingredients present in the aqueous phase. Thereafter, 100 parts by weight of distilled water was added to the residue and the microcapsules were dispersed to obtain a suspension again.

The microcapsules containing a hardening accelerator obtained were thus subjected to centrifugal separation and water washing repeatedly, and then dried. Thus, the microcapsules were isolated as freely flowable powder particles. The particles obtained had an average particle diameter of 2 μm.

EXAMPLES 1 TO 5 AND COMPARATIVE EXAMPLES 1 TO 4

The ingredients shown in Tables 1 and 2 were mixed according to each of the formulations shown in the tables. Each mixture was kneaded with a mixing roll mill, subsequently cooled, and then pulverized to obtain a target epoxy resin composition in powder form. Conditions for kneading with the mixing roll mill (kneading temperature and kneading period) are also shown in Tables 1 and 2.

TABLE 1

| | (parts by weight) Example | | | | |
|---|---|---|---|---|---|
| | 1 | 2 | 3 | 4 | 5 |
| Epoxy resin | 128 | 128 | 128 | 128 | 128 |
| Phenolic resin | 99 | 99 | 99 | 99 | 99 |
| Inorganic filler D1 | 1280 | 1000 | — | 640 | 890 |
| Inorganic filler D2 | — | — | 1280 | 640 | 490 |
| Inorganic filler D3 | — | — | 400 | — | — |
| Inorganic filler D4 | 550 | 300 | 150 | 550 | 450 |
| Release agent | 3 | 3 | 3 | 3 | 3 |
| Microcapsules containing hardening accelerator | 12 | 12 | 12 | 12 | 12 |
| Kneading temperature (° C.) | 130 | 130 | 130 | 130 | 130 |
| Kneading period (min) | 15 | 15 | 15 | 15 | 15 |

TABLE 2

| | (parts by weight) Comparative Example | | | |
|---|---|---|---|---|
| | 1 | 2 | 3 | 4 |
| Epoxy resin | 128 | 128 | 128 | 128 |
| Phenolic resin | 99 | 99 | 99 | 99 |
| Inorganic filler D1 | 1600 | 400 | 1000 | 930 |
| Inorganic filler D2 | 220 | — | — | 500 |
| Inorganic filler D3 | — | 620 | 400 | — |
| Inorganic filler D4 | — | 800 | 430 | 400 |
| Release agent | 3 | 3 | 3 | 3 |
| Microcapsules containing hardening accelerator | 12 | 12 | 12 | 12 |
| Kneading temperature (° C.) | 130 | 130 | 130 | 130 |
| Kneading period (min) | 15 | 15 | 5 | 5 |

The epoxy resin compositions for semiconductor encapsulation thus obtained in the Examples and Comparative Examples were evaluated for properties by the following methods. The results obtained are shown in Tables 3 and 4 which will be given later.

[Viscosity at 175° C. Shown by a Flow Tester Viscosity]

A 6 mesh-pass powder of an epoxy resin composition was examined with Koka flow tester Type CFT-100, manufactured by Shimadzu Corp., by the method described above.

[Minimum Melt Viscosity]

A 6 mesh-pass powder of an epoxy resin composition was examined by the method described above. Namely, a pellet having a diameter of 25 mm and a weight of 2 g was formed from the powder by cold molding (pressure: 100 kg/cm$^2$). This pellet was examined with a dynamic viscoelastic meter (manufactured by Rheometrics Inc.) according to the method described above (see FIG. 1) under the following conditions.

Heating: 16° C./min

Frequency: 0.8 rad/s (shear rate, 5 s$^{-1}$)

Strain: 2%

[Viscosity Ratio]

A 6 mesh-pass powder of an epoxy resin composition was examined by the method described above. Namely, a pellet having a diameter of 25 mm and a weight of 2 g was formed from the powder by cold molding (pressure: 100 kg/cm$^2$). This pellet was examined with the dynamic viscoelastic meter according to the method described above (see FIG. 1) under the following conditions to measure the viscosity thereof at 90° C. (Z1) and that at 110° C. (Z2). The ratio of the former to the latter viscosity was calculated.

Temperature rising: 16° C./min

Frequency: 0.8 rad/s (shear rate, 5 s$^{-1}$)

Strain: 2%

Furthermore, each of the powdery epoxy resin compositions obtained in the Examples and Comparative Examples given above was used to produce semiconductor devices [160 pin quad flat package; QFP 160 pin (28 mm×28 mm×3.0 mm, thickness)] through transfer molding (conditions: 175° C.×90 sec) and subsequent 5 hour post-cure at 175° C.

[Degree of Gold Wire Deformation]

Figure 2:
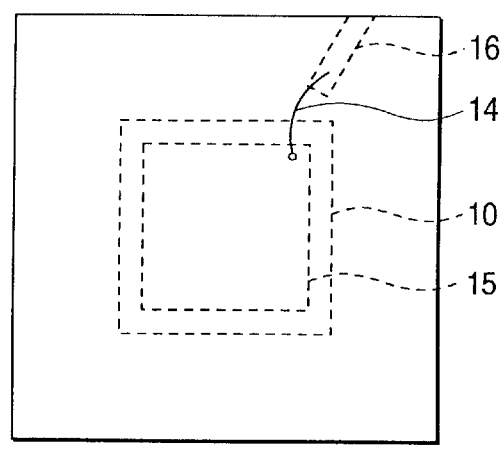
FIG. 2 is a front view illustrating a QFP 160 pin used for determining the amount of gold wire deformation.
Figure 3:
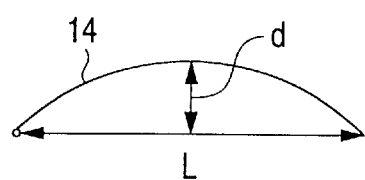
FIG. 3 is a view illustrating a method for determining the amount of gold wire deformation.

As shown in FIG. 2, gold wires 14 (diameter, 30 μm; maximum length, 3.8 mm) were attached to each of the QFP 160 pin frames having a 9.5 mm-square die pad 10. These semiconductor elements were encapsulated with each of the epoxy resin compositions obtained above to produce packages. In FIG. 2, numeral 15 denotes a semiconductor chip and 16 a lead pin. The packages produced were examined with an X-ray analyzer to determine the amount of gold wire deformation in the following manner. Ten gold wires were selected in each package, and each gold wire 14 was viewed from the front direction to measure the amount of gold wire deformation as shown in FIG. 3. The amount of wire deformation was measured on that part of the gold wire 14 where the deformation was largest, and this found value was taken as the value of gold wire deformation (d mm) for the package. From the value of d was calculated the degree of gold wire deformation [(d/L)×100], wherein L is the distance (mm) between the ends of the gold wire 14.

[Evaluation of Molding Failure]

The semiconductor devices obtained were examined for molding failures and the number of semiconductor devices having molding failures (per hundred semiconductor devices) was counted. Namely, the QFP 160 pin's were encapsulated and then examined for void formation to count rejected semiconductor devices. The void examination was made with a soft X-ray spectrometer, and semiconductor devices having voids with a diameter of 0.1 mm or larger were regarded as rejects.

[Amount of Die Pad Deformation]

Figure 4:
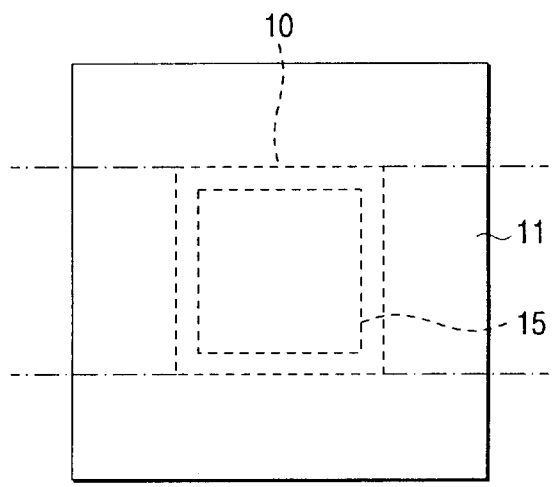
FIG. 4 is a front view illustrating a QFP 160 pin molded with an epoxy resin composition for semiconductor encapsulation.
Figure 5:
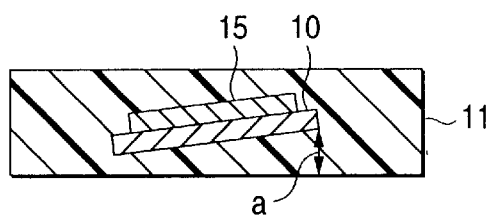
FIG. 5 illustrates a method for measuring a die pad shift; in which (a) is a sectional view showing a state in which a die pad shift has occurred, and (b) is a sectional view showing a normal state.
Figure 5:
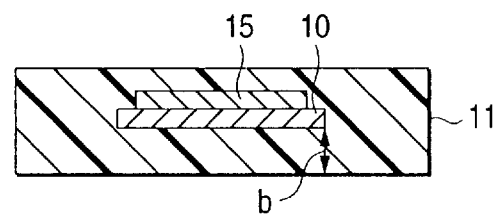

Each epoxy resin composition described above was used to form 160 pin quad flat packages 11 which, as shown in FIG. 4, had a 9.5 mm-square die pad 10 having a semiconductor chip 15 mounted thereon. The resulting packages 11 each was cut (along the planes indicated by the alternate long and short dash lines) and the sections were examined to measure the amount of die pad deformation in terms of the difference between the actual position and the designed position in the following manner. Namely, in a package which had undergone a die pad shift, the thickness (a μm) of the resin underlying each of the four corners of the die pad 10 was measured as shown in FIG. 5(a). On the other hand, in a package which had not undergone a die pad shift, the thickness (b μm) of the resin underlying each of the four corners of the die pad 10 was measured as shown in FIG. 5(b). This resin thickness measurement was made with respect to all the four corners of each die pad 10, and the difference between each found value and the value in normal packages (a-b) was determined in terms of absolute value. The average of these difference values was taken as the amount of die pad deformation.

The results of the above evaluations of semiconductor devices are shown in Tables 3 and 4 below.

TABLE 3

|  | Example | | | | |
| --- | --- | --- | --- | --- | --- |
|  | 1 | 2 | 3 | 4 | 5 |
| Flow tester viscosity (poise) | 300 | 50 | 500 | 300 | 300 |
| Minimum melt viscosity (× $10^4$ poise) | 4 | 1 | 10 | 10 | 7 |
| Viscosity ratio (90° C./110° C.) | 2.5 | 2 | 3.2 | 2 | 2.2 |
| Degree of gold wire deformation (%) | 1.1 | 0 | 3.1 | 2.9 | 2.4 |
| Molding failure, void generation (number of rejects per 100 packages) | 0 | 8 | 0 | 2 | 1 |
| Amount of die pad deformation (μm) | 10 | 0 | 21 | 18 | 12 |

TABLE 4

|  | Comparative Example | | | |
| --- | --- | --- | --- | --- |
|  | 1 | 2 | 3 | 4 |
| Flow tester viscosity (poise) | 40 | 520 | 130 | 200 |
| Minimum melt viscosity (× $10^4$ poise) | 4 | 23 | 18 | 13 |
| Viscosity ratio (90° C./110° C.) | 2.3 | 2.2 | 2 | 1.5 |
| Degree of gold wire deformation (%) | 1.2 | 9.6 | 7.2 | 6.7 |
| Molding failure, void generation (number of rejects per 100 packages) | 92 | 0 | 16 | 3 |
| Amount of die pad deformation (μm) | 13 | 100 | 46 | 65 |

The results given in Tables 3 and 4 show that the semiconductor devices produced with the epoxy resin compositions obtained in Examples 1 to 5, which each had all the properties (X) to (Z), had undergone no gold wire deformation, little void generation, and only a slight die pad shift and hence had high reliability. In contrast, the comparative semiconductor devices proved to be inferior in at least one of gold wire deformation, void generation, die pad deformation, etc.

INDUSTRIAL UTILIZATION POSSIBILITY

As described above, the epoxy resin composition for semiconductor encapsulation of the present invention, when used as an encapsulation material, does not cause the chip tilting attributable to resin flow during resin encapsulation, such as semiconductor element shifting and gold wire deformation, because it has properties (X) to (Z) described hereinabove. As a result, highly reliable semiconductor devices can be obtained.

By regulating the content of the inorganic filler as a component of the epoxy resin composition for semiconductor encapsulation to a value within a specific range, the packages formed from the composition can decrease water absorption. As a result, the semiconductor devices produced with the composition can retain high reliability after mounting.

Furthermore, when the hardening accelerator as a component of the epoxy resin composition for semiconductor encapsulation is microcapsules containing a hardening accelerator which have a core/shell structure composed of a core comprising the hardening accelerator and a shell comprising a synthetic resin with which the core is covered, the components of the epoxy resin composition can be melt-kneaded for a longer period than conventional ones and at a higher temperature. As a result, it is easy to obtain an epoxy resin composition having the viscosity properties (X) to (Z) described above.

What is claimed is:

1. An epoxy resin composition for semiconductor encapsulation which comprises an epoxy resin, a phenolic resin, a hardening accelerator and an inorganic filler, said epoxy resin composition having the following properties (X) to (Z):

(X) the viscosity thereof as measured with a flow tester at 175° C. is from 50 to 500 poise;

(Y) the minimum melt viscosity thereof as determined from the temperature dependence of viscosity thereof as measured with a dynamic viscoelastic meter at a shear rate of 5 (1/s) is $1 \times 10^5$ poise or lower, and (Z) the ratio of the viscosity thereof as measured at 90° C. (Z1) to that as measured at 110° C. (Z2) both with a dynamic viscoelastic meter at a shear rate of 5 (1/s), (Z1/Z2), is 2.0 or higher, wherein the content of the inorganic filler is from 80 to 92% by weight based on the whole epoxy resin composition.

2. The epoxy resin composition for semiconductor encapsulation as claimed in claim 1, wherein the hardening accelerator comprises microcapsules containing a hardening accelerator which have a core/shell structure comprising a core comprising the hardening accelerator and a shell comprising a synthetic resin with which the core is covered.

3. A semiconductor device produced by encapsulating a semiconductor element with the epoxy resin composition of any one of claims 1 or 2.

4. A method for encapsulating a semiconductor chip, comprises encapsulating the chip with the epoxy resin composition of any one of claims 1 or 2.

5. A method for producing a semiconductor device, comprising encapsulating a semiconductor element with the epoxy resin composition of any one of claims 2 or 4.

* * * * *